TEMPERATURE COMPENSATED RESONANT CIRCUIT

Filed July 30, 1956

INVENTOR.
HARRIS A. STOVER
BY
Marvin Moody
ATTORNEY

United States Patent Office 2,810,834

Patented Oct. 22, 1957

2,810,834

TEMPERATURE COMPENSATED RESONANT CIRCUIT

Harris A. Stover, Cedar Rapids, Iowa, assignor to Collins Radio Company, Cedar Rapids, Iowa, a corporation of Iowa Application July 30, 1956, Serial No. 600,891

6 Claims. (Cl. 250—40)

This invention pertains to radio tuning devices that are temperature compensated for maintaining their resonant frequency constant in spite of ambient temperature variations.

Fixed temperature compensated capacitors have commonly been used with variable tuning inductors in radio tuning circuits to maintain the frequency of the circuit at a constant value for different ambient temperatures. These capacitors are selected for obtaining exact temperature compensation at a selected frequency within the tuning range of the variable inductor. Since at frequencies other than the selected frequency the temperature compensation is only approximate, exact compensation is not obtained throughout the entire frequency range of the tuning system. In the temperature compensated device of this invention, one of the plates of the temperature compensating capacitor is positioned by the tuning mechanism for the variable inductor, and the other plate of the capacitor is mounted on a temperature compensating actuator that varies according to tempreature to change the spacing between the plates. When the sizes of the capacitor plates have been properly determined for the type of actuator being used, the proper amount of capacitance compensation is supplied by the relative position of the plates to provide nearly perfect temperature compensation at any frequency within the range of the tuning device.

An object of the present invention is to provide means to compensate for temperature changes in tuning circuits at all frequency settings within their ranges.

Another object is to provide capacitors that change in temperature compensating characteristics with response to change in position of associated tuning cores.

The temperature compensating device of the present invention may be readily understood by reading the following description with reference to the accompanying drawings, in which.

Figures 1, 2, 3, 4:
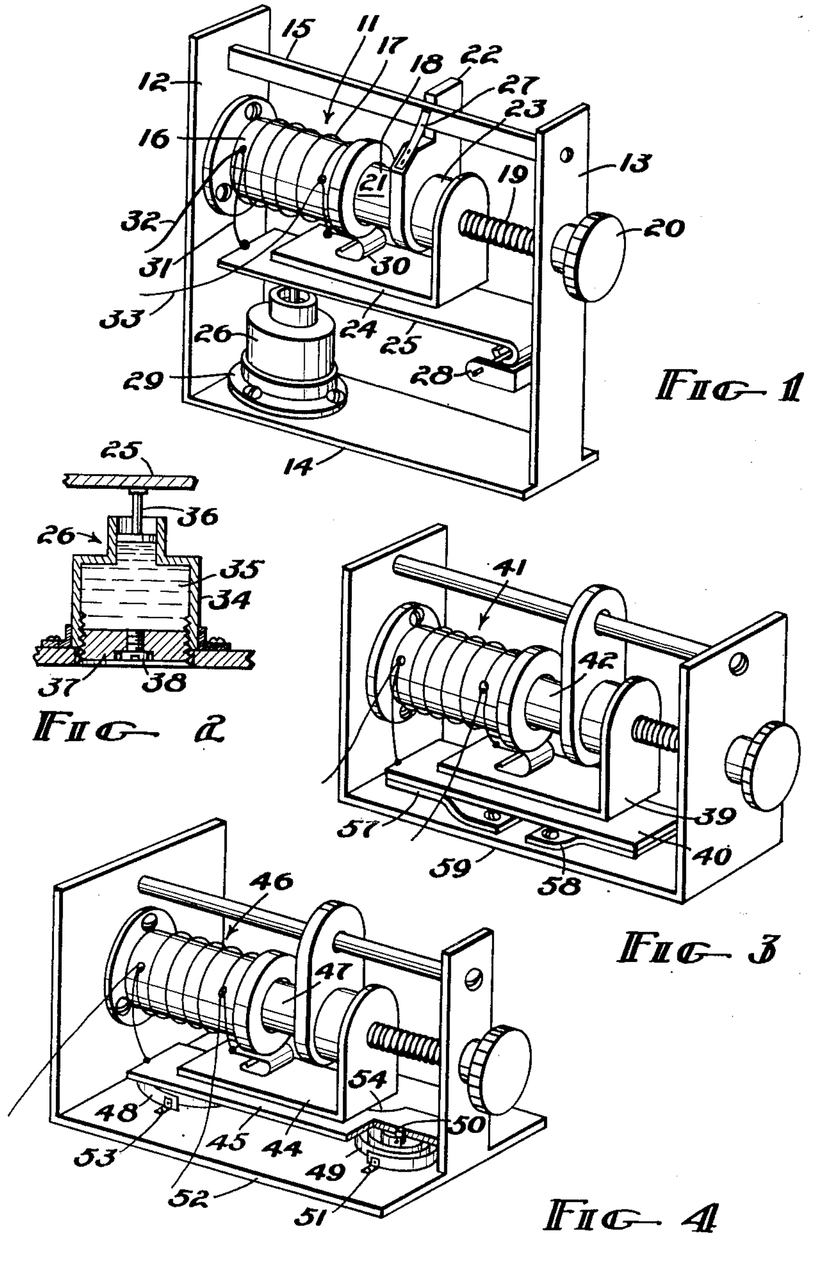
Figure 1 is a perspective view of tuning apparatus that has a temperature compensated capacitor in combination with a variable inductor, one plate of the capacitor being hinged at one end and the other end being mounted on a hydraulic temperature compensating device.
Figure 2 is a vertical cross-sectional view of the temperature compensating device of Figure 1.
Figure 3 is a perspective view of tuning apparatus similar to that shown in Figure 1 except that the temperature compensating plate is mounted at each end by a bimetal strip.
Figure 4 is a perspective view of tuning apparatus in which bimetal spirals provide coplanar movement of one of the capacitor plates.

In Figure 1, the temperature compensating device is shown used in conjunction with inductor 11. The inductor is mounted between two mounting plates 12 and 13 that are fixed apart by member 14 and bar 15. A cylindrical inductor form 16 upon which is wound a winding 17 is fixed to mounting plate 12. This form may be molded from low-loss insulating material. Greater stability in inductance is obtained by imbedding the winding in the form when it is being molded. The inductance of winding 17 is controlled by the position of tuning core 18 that is mounted on lead screw 19 which is rotatable for providing coaxial movement of the core within the cylindrical inductor form. Lead screw 19 is rotatably mounted between end mounting plates 12 and 13, and extends through plate 13 for receiving knob 20.

Core assembly 21 includes core 18 that has a threaded insert for receiving shaft 19, a follower 22 that is fixed to the core to prevent its rotation, and insulating bushing 23 that is fastened to the end of the core nearest the control knob and a capacitor plate 24 which is secured to bushing 23 so as to be insulated from the core and the lead screw. In addition to plate 24, the temperature compensating capacitor includes the adjacent plate 25 which is hinged at one end and is fastened to temperature compensating device 26 at the other end. Plate 24 is in the form of a right angle so that movement of the core to which it is attached causes the plate to move along the surface of plate 25.

Follower 22 extends radially from the core to engage a linear cam. The cam may be bar 15 that extends between mounting plates 12 and 13. The follower is held against one side of the cam by spring 27 that contacts the opposite side. When the lead screw 19 is rotated, the core assembly 21 moves axially to change the inductance of winding 17; and plate 24 is moved relative to adjustable temperature compensating plate 25 that is mounted approximately parallel thereto. A knob 20 is shown for manually rotating the lead screw, but, of course, instead of being connected to a knob, the lead screw may be connected to a mechanical tuning system.

The capacitor plate 25 has one end hinged by hinge 28 to mounting plate 13 and the other end attached to temperature compensating device 26 which is fastened by mounting ring 29 to frame member 14. The temperature compensating capacitor is connected in parallel with winding 17 of inductor 11, the plate 24 of the capacitor being connected through sliding contact 30 to one end of the winding, and plate 25 being connected through lead 31 to the other end of the winding. The parallel combination is connected through leads 32 and 33 to associated electrical circuits, for example, signal generator circuits.

The temperature compensating actuator may be selected from various types that readily change dimensions or shapes with temperature changes. In Figure 2, the temperature compensating actuator 26 includes cylinder 34 that is filled with fluid 35. A piston 36 fits into one end of cylinder 34. The exact position of the piston is dependent upon the volume of the fluid. In the end of the cylinder that is opposite the piston, is an adjustable threaded plug 37 and threaded filler plug 38. Plug 37 may be turned either inwardly or outwardly for adjusting the position of the piston and the attached capacitor plate 25. The cylinder and plugs are most readily fabricated from a metal, such as brass. The fluid contained within the piston may be an oil that has greater temperature coefficient of expansion than that of the cylinder. The actual displacement of the piston is determined by the difference between the coefficient expansion of the cylinder and that of the fluid contained therein.

The arrangement shown in Figure 1 may be modified to satisfy the temperature characteristics of the resonant circuit. In the arrangement shown, when the tuning core assembly 21 is moved inwardly, capacitor plate 24 is moved closer to that end of the plate 25 which is positioned by temperature compensating device 26. Through this arrangement, greater capacitance change due to temperature compensation is obtained at the low-frequency end of the tuning range than is obtained at the highfrequency end of the tuning range. Also, this arrangement provides an increase of capacitance with an increase of temperature, such as would be required when the tuning core has more than enough negative temperature coefficient of permeability to overcome the positive temperature coefficient that is inherent in the usual inductor winding. Commonly, the capacitor must provide a decrease in capacitance with an increase in temperature change. This negative temperature compensation may be obtained either by mounting the hydraulic temperature compensating device 26 on the opposite side of adjustable temperature compensating plate 25 shown in Figure 1 or by attaching the end of capacitor plate 25 to piston 36 through a lever. When required, the end of capacitor plate 25 that is shown connected to hinge 28 may be connected to a second temperature compensating device rather than to the hinge.

In Figure 3, a temperature compensating capacitor that consists of plates 39 and 40 is connected across the winding of inductor 41 which is tuned by movement of tuning core 42. The tuning apparatus of Figure 3 is like that of Figure 1 except that the temperature compensating plate 40 is mounted onto two bimetal strips 57 and 58 which are fastened to frame member 59. Temperature changes cause the displacement of the bimetal strip, and this displacement determines the distance between capacitor plates 39 and 40.

In Figure 4 capacitor plates 44 and 45 are connected in parallel with the winding of tuning inductor 46. As described previously, this inductor is tuned by axial movement of core 47 to which is rigidly fastened capacitor plate 44. However, the compensating capacitor operates somewhat differently in that plate 45 moves in the direction of its plane to vary the amount by which the capacitor plates overlap. The plate is moved laterally by bimetal spirals 48 and 49. Spiral 49 has its inside turn connected to pin 50 that is connected to capacitor compensating plate 45 and its outside turn is connected to a tab 51 that is attached to mounting plate 52. At the opposite end of capacitor plate 45, the inside turn of spiral 48 is secured to the capacitor plate and the outside turn is secured to tab 53 that is fastened to mounting plate 52. The brackets may be mounted by adjustable screws so that plate 45 may be moved in a direction perpendicular to its plane for changing distance between the plates.

An advantage derived from using lateral movement of temperature compensating capacitor plate like that shown in Figure 4 is that an edge of one plate, for example, edge 54 of plate 45 may be formed to vary capacitance according to the particular requirements of a tuning circuit. It is obvious that as the edge of plate 45 is moved opposite plate 44 that variation in capacitance as determined by temperature change depends on the configuration of plate 45.

As ambient temperature changes, the temperature compensating capacitor of this invention provides constant resonant frequency of a tuning circuit at any position of a tuning shaft. In the tuning device illustrated in Figure 1, a higher temperature causes the form and winding of inductor 11 to expand. This change in dimensions tends to lower the frequency at which the circuit is resonant. However, ferromagnetic core 18 may be fabricated from material that has a negative temperature coefficient of permeability so that change in permeability of the core compensates for change in the dimension of the inductor winding. Practically, the winding and core cannot be matched perfectly to provide exact temperature compensation.

When the effect of the negative temperature coefficient of the core is greater than the effect of the expansion of the winding, the temperature compensating capacitor may be arranged as shown in Figure 1. Without the capacitor, the resonant frequency of the circuit would tend to become higher with an increase of temperature. To maintain a constant frequency, the fluid 35 in hydraulic actuator 26 expands for moving piston 36 and attached capacitor plate 25 outwardly for increasing capacitance between plates 24 and 25. The change in capacitance provides required compensation for maintaining the resonant frequency of the circuit constant.

Adjustable plug 37 in the end of the cylindrical compensating actuator 26 may be turned inwardly for obtaining greater temperature compensation. Obviously, as capacitor plate 24 moves toward temperature compensating actuator 26 while tuning core 23 is moved inwardly, the ratio of change in capacitance per degree change in temperature is increased to provide required compensation.

The temperature compensating capacitor of this invention may be applied to the tuning unit described in U. S. Patent 2,468,071 issued to Theodore A. Hunter on April 26, 1949. Application of this embodiment requires that the capacitor plate which is actuated by the tuning mechanism be separated from the core, and that both the core and the insulated bushing for mounting the capacitor plate have individual followers and separate threaded inserts for mounting on the tuning lead screw. The cam that is engaged by the follower that prevents rotation of the capacitor plate may be like those shown in the accompanying drawing, whereas the cam and follower for the tuning core may be designed in accordance with the teaching of the Hunter patent cited above. To provide linear tuning, the tuning core will then rotate over a limited range as the follower is moved along an adjustable cam. However, the capacitor plate that is positioned by the tuning apparatus will be moved axially without rotation so that it will not rotate wtih respect to the adjacent temperature compensating capacitor.

Although this invention has been described with respect to particular embodiments thereof, it is not to be so limited as changes and modifications may be made therein which are within the full intended scope of the invention as defined by the appended claims.

What is claimed is:

1. In combination, a variable inductor and a temperature compensating capacitor, said variable inductor including a winding and a tuning core, tuning means for moving said core relative to said winding for changing the inductance thereof, first and second capacitor plates for said temperature compensating capacitor, said plates being connected to different points on said winding, said first plate being mechanically connected to said tuning means so that operation of said tuning means to move said core changes position of said first plate with respect to said second plate, and a temperature compensating actuator mechanically connected to said second plate to vary the distance between said capacitor plates.

2. Radio tuning apparatus having a variable inductor and a temperature compensating capacitor, said temperature compensating capacitor having first and second plates, said inductor having a helical winding and a tuning core axially positioned with respect to said winding, said plates being connected to different points on said winding, means for continuously moving said core axially with respect to said winding, said first plate being mechanically connected to said core for moving in unison therewith in a plane parallel with said second plate, a hydraulic temperature compensating device comprising a container filled with fluid, a piston and an adjustable plug disposed within the walls of said container, said second plate being fastened to said piston, and said piston being operated by a change in volume of said fluid for varying the distance between said plates.

3. In combination, a variable inductor and a temperature compensating capacitor, said variable inductor having a winding and a ferromagnetic core movable axially within said winding, said capacitor having first and second plates connected to different points on said winding, said first plate being mounted on a plurality of temperature compensating actuators, tuning means for moving said core axially with respect to said winding, and said second plate being connected to said tuning means for moving said second plate in a closely spaced relation over said first plate.

4. A combination of variable inductor and temperature compensating capacitor as claimed in claim 3 wherein said temperature compensating actuators are hydraulic temperature compensating devices.

5. A combination of variable inductor and temperature compensating capacitor as claimed in claim 3 wherein said temperature compensating actuators are bimetal strips.

6. A radio tuning device comprising a variable inductor and a temperature compensating capacitor, said variable inductor having a winding and a tuning core movable within said winding, tuning means for positioning said core for changing the inductance of said winding, said temperature compensating capacitor having first and second plates connected to different points on said winding, said first plate being coupled to said tuning means, temperature compensating actuator means, said second plate being mounted by said temperature compensating actuator means with a plane surface closely spaced to a plane surface of said first plate, said second plate having an edge formed according to capacitor change requirements, said temperature compensating actuator means responsive to ambient temperature changes to move said second plate laterally so that said formed edge is moved past an edge of said first plate, and said plates being positioned relative to each other by operation of said tuning means and said temperature compensating means to vary the amount by which they overlap and thereby to vary the capacitance of said temperature compensating capacitor.

No references cited.